United States Patent
Godet et al.

(10) Patent No.: US 9,947,539 B2
(45) Date of Patent: Apr. 17, 2018

(54) PLASMA POISONING TO ENABLE SELECTIVE DEPOSITION

(71) Applicant: Applied Materials, Inc., Santa Clara, CA (US)

(72) Inventors: Ludovic Godet, Sunnyvale, CA (US); Srinivas D. Nemani, Sunnyvale, CA (US); Tobin Kaufman-Osborn, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/658,266

(22) Filed: Jul. 24, 2017

(65) Prior Publication Data

US 2017/0323778 A1      Nov. 9, 2017

Related U.S. Application Data

(62) Division of application No. 15/075,046, filed on Mar. 18, 2016, now Pat. No. 9,716,005.

(51) Int. Cl.
| | |
|---|---|
| *H01L 21/02* | (2006.01) |
| *H01L 21/263* | (2006.01) |
| *H01L 21/027* | (2006.01) |
| *H01L 21/285* | (2006.01) |

(52) U.S. Cl.
CPC ........ *H01L 21/263* (2013.01); *H01L 21/0228* (2013.01); *H01L 21/0243* (2013.01); *H01L 21/0274* (2013.01); *H01L 21/02315* (2013.01); *H01L 21/02639* (2013.01); *H01L 21/28556* (2013.01)

(58) Field of Classification Search
CPC combination set(s) only.
See application file for complete search history.

(56) References Cited

U.S. PATENT DOCUMENTS

| | | | |
|---|---|---|---|
| 5,685,942 | A | 11/1997 | Ishii |
| 5,707,486 | A | 1/1998 | Collins et al. |
| 5,919,332 | A | 7/1999 | Koshiishi et al. |
| 5,958,140 | A | 9/1999 | Arami et al. |
| 6,114,258 | A | 9/2000 | Miner et al. |
| 6,211,092 | B1 | 4/2001 | Tang et al. |
| 6,562,720 | B2 | 5/2003 | Thilderkvist et al. |
| 6,624,084 | B2 | 9/2003 | Maeda et al. |
| 6,635,185 | B2 | 10/2003 | Demmin et al. |
| 6,746,961 | B2 | 6/2004 | Ni et al. |
| 6,894,245 | B2 | 5/2005 | Hoffman et al. |
| 6,998,014 | B2 | 2/2006 | Chen et al. |
| 7,300,597 | B2 | 11/2007 | Chae et al. |

(Continued)

FOREIGN PATENT DOCUMENTS

| | | |
|---|---|---|
| JP | 05-335239 | 12/1993 |
| JP | 06-177048 | 6/1994 |

OTHER PUBLICATIONS

Agarwal and Kushner, "Plasma Atomic Layer Etching Using Conventional Plasma Equipment," Journal of Vacuum Science and Technology, Jan./Feb. 2009, 27: 37-50.

*Primary Examiner* — Mamadou Diallo
(74) *Attorney, Agent, or Firm* — Fish & Richardson P.C.

(57) ABSTRACT

Atomic layer deposition in selected zones of a workpiece surface is accomplished by transforming the surfaces outside the selected zones to a hydrophobic state while the materials in the selected zones remain hydrophilic.

14 Claims, 7 Drawing Sheets

(56) References Cited

U.S. PATENT DOCUMENTS

| | | |
|---|---|---|
| 7,416,989 B1 | 8/2008 | Liu |
| 2001/0010257 A1 | 8/2001 | Ni et al. |
| 2002/0192369 A1 | 12/2002 | Morimoto et al. |
| 2003/0024902 A1 | 2/2003 | Li et al. |
| 2003/0037880 A1 | 2/2003 | Carducci et al. |
| 2003/0037881 A1 | 2/2003 | Barnes et al. |
| 2003/0092266 A1 | 5/2003 | Anderson et al. |
| 2003/0232504 A1 | 12/2003 | Eppler et al. |
| 2004/0050325 A1 | 3/2004 | Samoilov et al. |
| 2004/0083964 A1 | 5/2004 | Ingle et al. |
| 2005/0022933 A1 | 2/2005 | Howard |
| 2005/0051272 A1 | 3/2005 | Collins et al. |
| 2005/0077010 A1 | 4/2005 | Goto |
| 2005/0090118 A1 | 4/2005 | Shannon et al. |
| 2006/0000803 A1 | 1/2006 | Koshiishi et al. |
| 2006/0042754 A1 | 3/2006 | Yoshida et al. |
| 2006/0169671 A1 | 8/2006 | Miya et al. |
| 2006/0191637 A1 | 8/2006 | Zajac et al. |
| 2007/0163994 A1 | 7/2007 | Rauf et al. |
| 2007/0181254 A1 | 8/2007 | Iida et al. |
| 2007/0240778 A1 | 10/2007 | L'Bassi et al. |
| 2007/0246162 A1 | 10/2007 | Paterson et al. |
| 2007/0247075 A1 | 10/2007 | Kim et al. |
| 2007/0249173 A1 | 10/2007 | Kim et al. |
| 2007/0251917 A1 | 11/2007 | Bera |
| 2007/0251918 A1 | 11/2007 | Bera et al. |
| 2007/0254483 A1 | 11/2007 | Bera et al. |
| 2007/0254486 A1 | 11/2007 | Bera et al. |
| 2008/0178805 A1 | 7/2008 | Paterson et al. |
| 2008/0179011 A1 | 7/2008 | Collins et al. |
| 2010/0193781 A1 | 8/2010 | Tripathy et al. |
| 2011/0139748 A1 | 6/2011 | Donnelly et al. |
| 2012/0097870 A1 | 4/2012 | Leray |
| 2012/0263876 A1* | 10/2012 | Haukka ................. C23C 16/402 427/255.18 |
| 2014/0210835 A1* | 7/2014 | Hong ................. H01L 29/78696 345/530 |
| 2014/0377963 A1* | 12/2014 | Ellinger ............ H01L 21/02642 438/763 |
| 2015/0345018 A1* | 12/2015 | Detavernier .......... C23C 16/403 428/422 |
| 2015/0380422 A1 | 12/2015 | Sharangpani |

\* cited by examiner

PLASMA POISONING TO ENABLE SELECTIVE DEPOSITION

CROSS REFERENCE TO RELATED APPLICATIONS

This application is a divisional of and claims priority to U.S. patent application Ser. No. 15/075,046, filed on Mar. 18, 2016, the entire contents of which is hereby incorporated by reference.

BACKGROUND

Technical Field

The disclosure concerns a method of forming layered structures by atomic layer deposition of materials, in accordance with a predetermined pattern of different materials in an integrated circuit.

Background Discussion

In some fabrication processes for forming integrated circuits, it is desirable to deposit thin films by atomic layer deposition (ALD) in accordance with a predetermined pattern. The pattern defines selective areas on a workpiece surface for deposition by an ALD process, while ALD is prevented in the other areas. Such a process is referred to herein as selective area atomic layer deposition. The problem is how to accurately govern the boundaries of the selective areas.

SUMMARY

A first method of performing atomic layer deposition in selected zones of a workpiece comprises: (a) providing a surface in each of the selected zones of a first material of a first type that is initially hydrophilic and that becomes hydrophobic upon treatment with a fluoro-carbon plasma or fluoro-carbon ion beam; (b) providing a surface of a second material in other zones of the workpiece that remains hydrophilic upon treatment with a fluoro-carbon plasma or fluoro-carbon ion beam; (c) performing a plasma treatment on the workpiece using a plasma derived from a fluoro-carbon species; and (d) performing an atomic layer deposition process on the workpiece, and growing an atomic layer of a growth material on surfaces of the selected zones while generally avoiding growth of an atomic layer of the growth material in the other zones.

In one embodiment, the first material comprises any material that becomes hydrophilic upon treatment with a fluoro-carbon plasma or fluoro-carbon ion beam, such as (but not limited to) for example one of W, Co, SiN, T-oxide, TEOS or Si. In one embodiment, the second material comprises any material that remains hydrophilic upon treatment with a fluoro-carbon plasma or fluoro-carbon ion beam, such as (but not limited to) one of Cu or TiN. In one embodiment, the growth material comprises a metal or an oxide of a metal.

In one embodiment, the method is repeated until a desired thickness of the growth material is reached.

In one embodiment, the method further comprises removing growth material defects in the other zones.

A second method of performing atomic layer deposition in selected zones of a workpiece comprises: (a) depositing a first photolithographic mask on the workpiece comprising first openings corresponding to portions of the selected zones; (b) treating the workpiece by exposure to species derived from a fluoro-carbon plasma; (c) removing the first photolithographic mask; (d) depositing a second photolithographic mask on the workpiece comprising second openings corresponding to remaining portions of the selected zones; (e) treating the workpiece by exposure to species derived from a fluoro-carbon plasma; (f) removing the second photolithographic mask; and (g) performing an atomic layer deposition process.

In one embodiment, the method further comprises removing growth material from areas outside of the selected zones.

In one embodiment, the treating the workpiece comprises forming a fluoro-carbon plasma and exposing the workpiece to the plasma. In one embodiment, the treating the workpiece comprises forming an ion beam from a fluoro-carbon plasma and directing the ion beam to the workpiece.

In one embodiment, the atomic layer deposition process produces a growth material. The growth material may be any material that can be formed by atomic layer deposition such as (but not limited to) metal, a non-metal or a metal oxide.

A third method of performing atomic layer deposition in selected zones of a workpiece comprises: (a) depositing a first photolithographic mask on the workpiece comprising first openings corresponding to portions of the selected zones; (b) treating the workpiece by exposure to species derived from a fluoro-carbon plasma; (c) removing the first photolithographic mask; (d) performing a first atomic layer deposition process on the workpiece; (e) depositing a second photolithographic mask on the workpiece comprising second openings corresponding to remaining portions of the selected zones; (f) treating the workpiece by exposure to species derived from a fluoro-carbon plasma; (g) removing the second photolithographic mask; and (h) performing a second atomic layer deposition process.

In one embodiment, the first and second atomic layer deposition processes deposit different growth materials on the workpiece.

In one embodiment, the treating the workpiece comprises forming a fluoro-carbon plasma and exposing the workpiece to the plasma. In one embodiment, the treating the workpiece by exposure to species derived from a fluoro-carbon plasma comprises forming an ion beam from a fluoro-carbon plasma and directing the ion beam to the workpiece.

In one embodiment, the first and second atomic layer deposition process produce on the workpiece different respective growth materials.

A first method of performing atomic layer deposition in selected zones of a workpiece having 3-dimensional structures on a surface thereof comprising vertical walls separated by trenches, comprises: (a) providing a directional plasma source emitting ions along an ion propagation direction toward the workpiece; (b) orienting the ion propagation direction relative to the vertical walls to enable the vertical walls to mask the selected zones from the ions emitted by the directional plasma source; and (c) performing an atomic layer deposition process on the workpiece.

In one embodiment, the directional plasma source emits ions in two beams tilted relative to the vertical walls through opposing angles and the two beams strike opposing ones of the vertical walls.

In one embodiment, the directional plasma source emits a beam tilted relative to the vertical walls and the beams strikes one of the vertical walls.

In one embodiment, the directional plasma source emits ions in one beam parallel to the vertical walls.

BRIEF DESCRIPION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
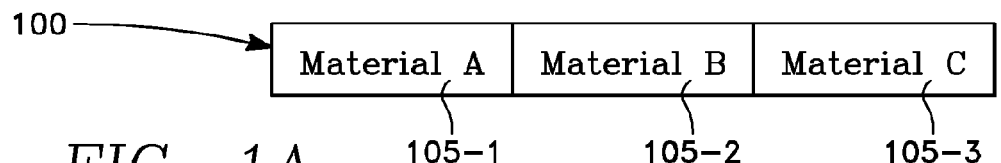
FIGS. 1A, 1B, 1C, 1D, 1E, 1F, 1G and 1H depict successive operations of a process performed on a workpiece in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Selective ALD formation of a deposited film employs plasma poisoning of the workpiece surface in accordance with a desired pattern. A fluoro-carbon plasma treats selected areas of the workpiece surface to transform those selected areas from a hydrophilic state to a hydrophobic state. Certain ALD processes are enabled on hydrophilic surfaces and disabled on hydrophobic surfaces. In essence, the fluoro-carbon plasma treatment altered (poisoned) the surface to prevent ALD formation of deposited films.

The pattern may be established in various ways. One way (Method I) is to provide a first material only in selective surface areas, the first material being one that becomes hydrophobic upon exposure to a fluoro-carbon. The remaining areas consist of a second material that remains hydrophilic. Another way (Method II) is to provide a material that is hydrophilic unless treated by a fluoro-carbon plasma, in which case it becomes hydrophobic. In this latter case, the desired pattern is realized by masking the selected surface areas during the plasma treatment. This masking may employ photoresist, for example. Yet another way (Method C) is to employ a directional plasma beam so as to exploit 3-dimensional features on the surface to shadow the plasma beam from selected portions of the surface.

Figure 1B:
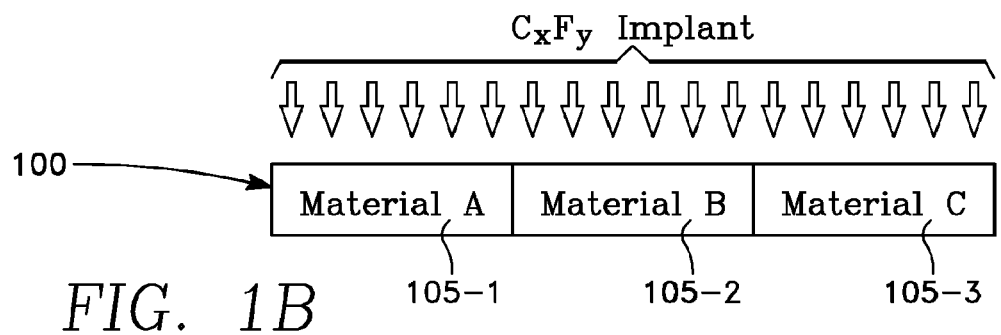
Figure 1C:
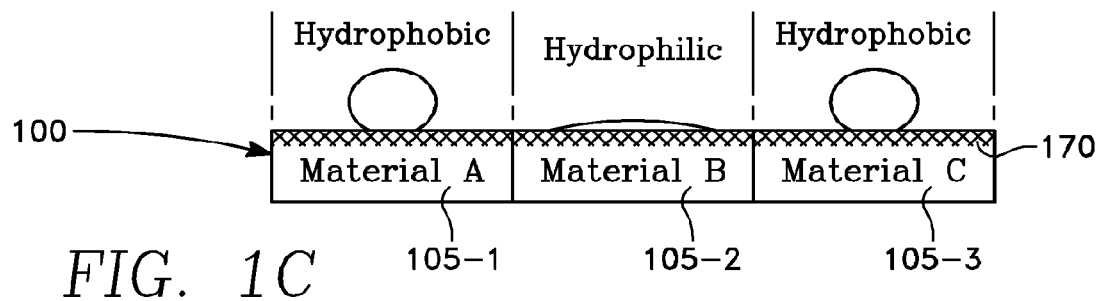
Figure 1D:
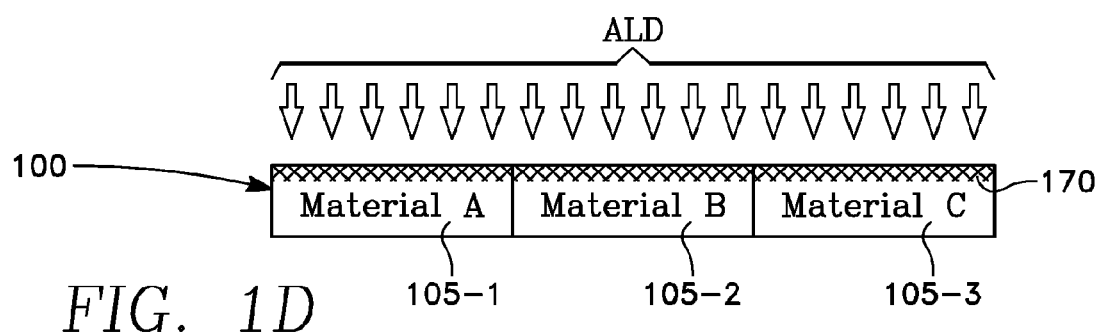
Figure 1E:
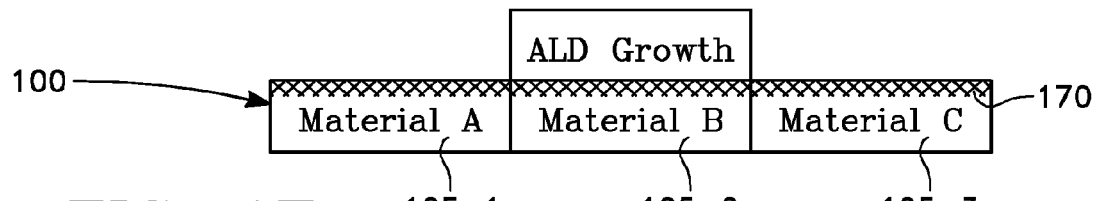
Figure 1F:
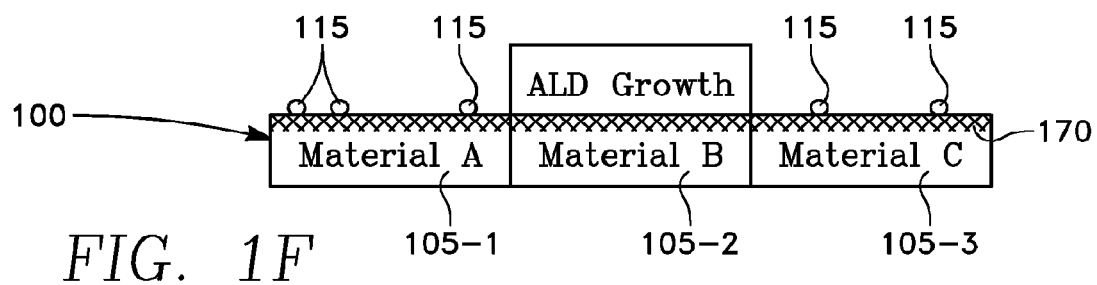
Figure 1G:
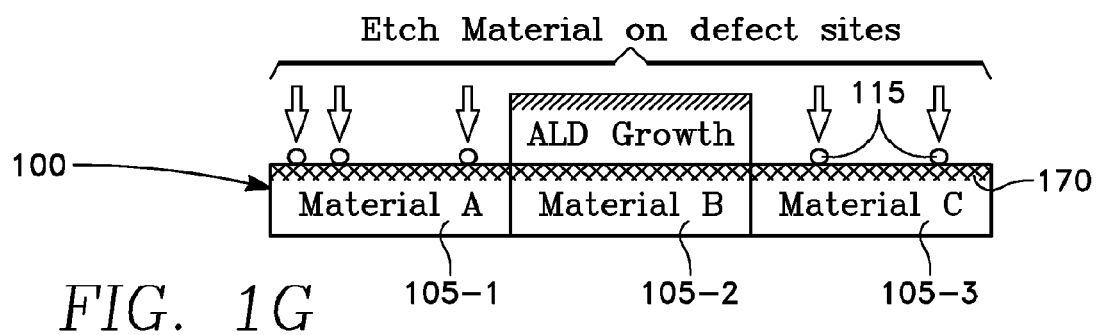
Figure 1H:
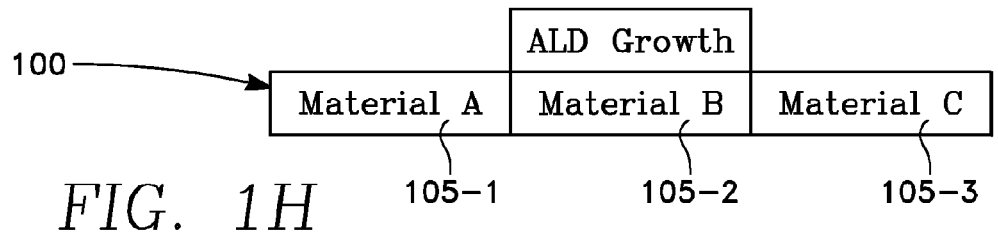

FIGS. 1A though 1H depict a first embodiment that employs Method I. FIG. 1A depicts a workpiece surface 100 having two or more zones 105-1 (Material A), 105-2 (Material B), 105-3 (Material C) of different characteristics. In FIG. 1B, the workpiece is subjected to a plasma treatment. The plasma treatment may be carried out by ion implantation of a fluoro-carbon species, or by exposure to an ion beam from a fluoro-carbon plasma (e.g., CF4). The plasma treatment forms a plasma treated surface layer 170. In the illustrated example, Materials A and C become hydrophobic upon plasma treatment by a fluoro-carbon plasma, while material B remains hydrophilic, as indicated symbolically in FIG. 1C. Next, as depicted in FIG. 1D, an ALD process is performed. The result is depicted in FIG. 1E, in which ALD deposition occurs only on Material B in zone 105-2. This is because Material B is hydrophilic, while Materials A and C are hydrophobic. FIG. 1F depicts an example in which the operation of FIG. 1D left small ALD deposits 115 in unselected areas. In this case, an ALD clean-up step depicted in FIG. 1G is performed, which removes the unwanted ALD deposits, and the thickness of the ALD deposited film in zone 105-2 is slightly reduced, as depicted in FIG. 1H.

Materials A and C, which become hydrophobic upon exposure to a fluoro-carbon plasma, can be selected from a wide range of materials, such as (but not limited to) W, Co, SiN, T-oxide, TEOS, a nitride, a metal, a metal oxide, a semiconductor or Si. Material B, which remains hydrophilic after exposure to a fluoro-carbon plasma, may be selected from a group of materials including Cu and TiN, for example.

The operations of FIGS. 1A through 1H may be repeated on the workpiece by a number of times until a desired thickness of ALD deposited film is reached. Prior to each repetition, an anneal process may be performed to remove the effects of the plasma treatment. Another way to remove the effect of fluorocarbon plasma treatment is by exposing the surface to another type of plasma such as, for example, an Ar plasma or a N plasma.

Figure 2A:
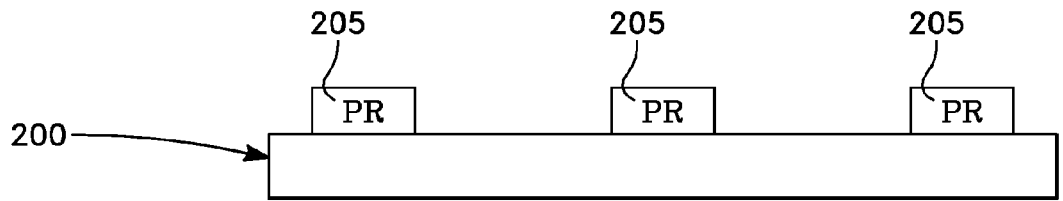
FIGS. 2A, 2B, 2C, 2D, 2E, 2F, 2G and 2H depict successive operations of a process performed on a workpiece in accordance with a second embodiment.
Figure 2B:
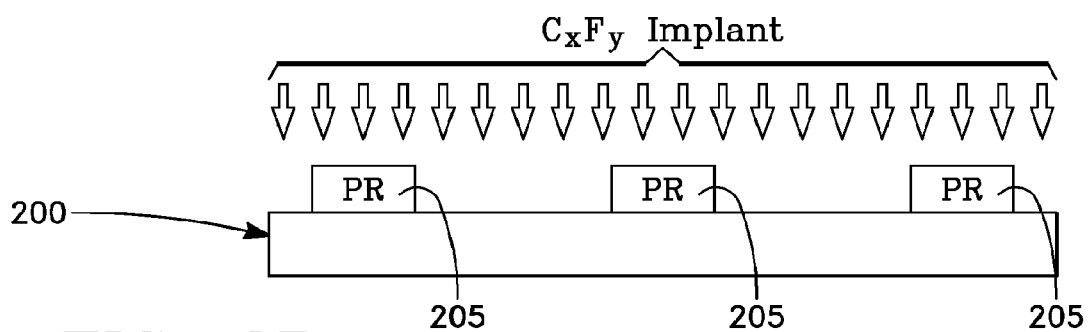
Figure 2C:
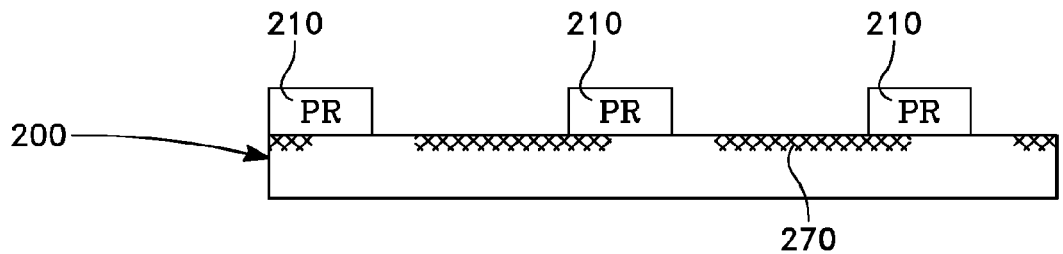
Figure 2D:
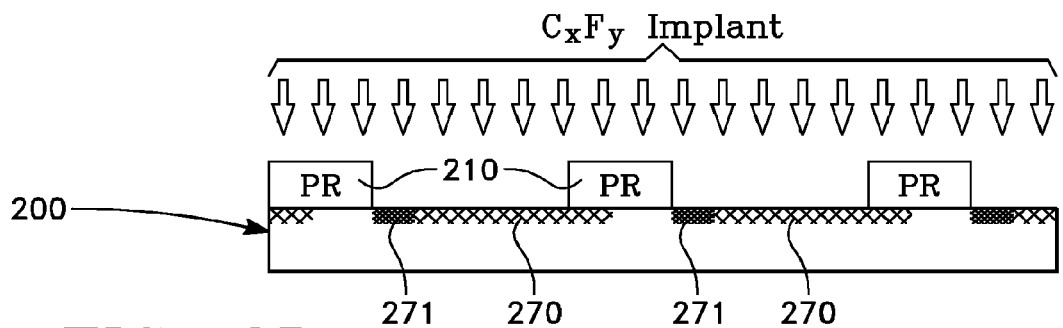
Figure 2E:
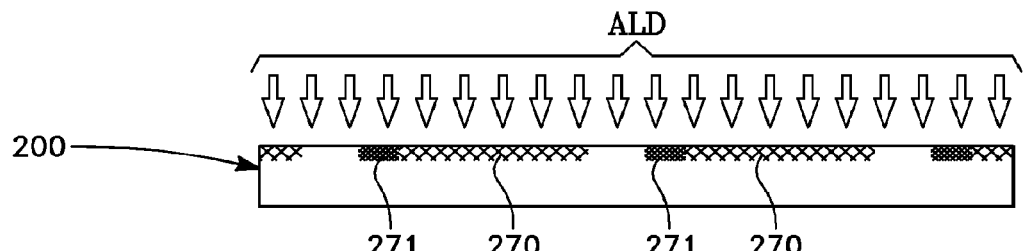
Figure 2F:
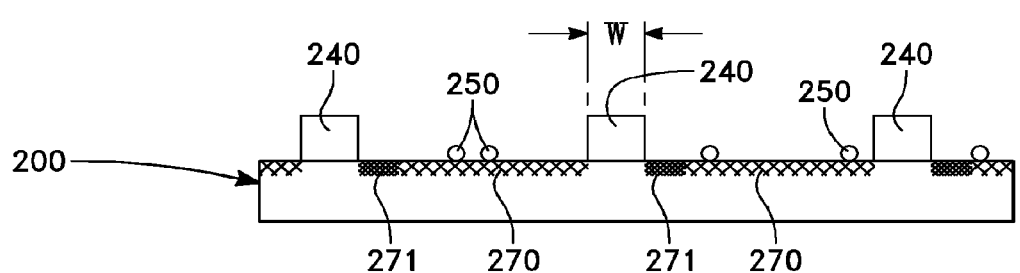

FIGS. 2A through 2H depict a process in accordance with a second embodiment. In FIG. 2A, a workpiece surface 200 is patterned by a photoresist layer 205 using photolithography, leaving portions of the workpiece surface 200 exposed. In the next operation, a plasma treatment operation depicted in FIG. 2B, the workpiece surface 200 is exposed to a fluoro-carbon plasma, forming a plasma treated surface layer 270 shown in FIG. 2C. The plasma treated surface layer 270 is formed in areas aligned with openings in the photoresist layer 205. Then, the photoresist layer 205 is removed and replaced by a new photoresist layer 210, as depicted in FIG. 2C. The pattern of the new photoresist layer 210 may be slightly shifted relative to the previous photoresist layer 205 (now removed), as shown in FIG. 2C. A second plasma treatment is performed as depicted in FIG. 2D, forming an additional plasma treated surface layer 271 extending beyond the first plasma treated surface layer 270, as shown in FIG. 2E. The plasma treated surface layers 270 and 271 are hydrophobic while the remainder of the workpiece surface 200 is hydrophilic. The second photoresist layer 210 is removed and an ALD process is performed, as indicated in FIG. 2E. The resulting ALD growth 240 shown in FIG. 2F occurs on the hydrophilic surfaces and has a narrow width W determined by the shift between the first and second photoresist layers 205, 210.

Figure 2G:
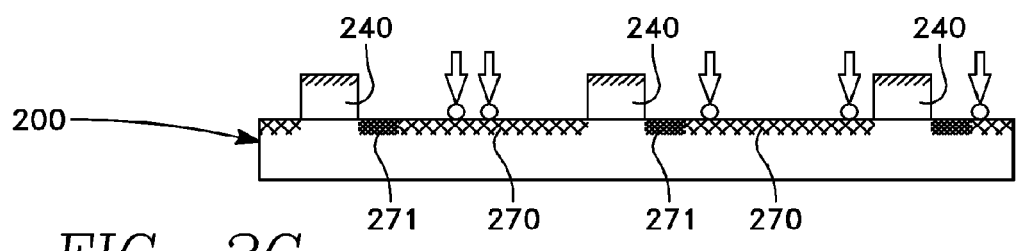
Figure 2H:
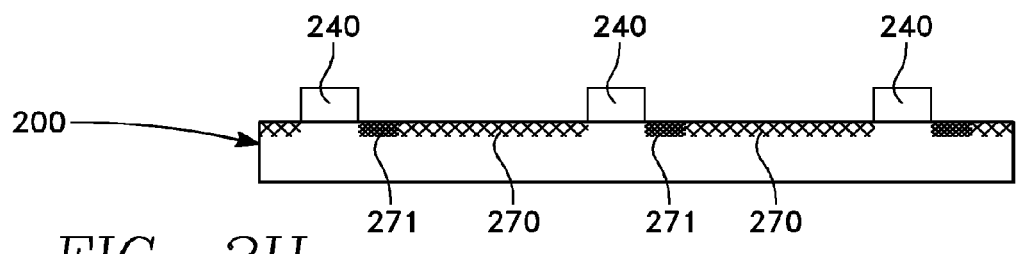

FIG. 2G illustrates an example in which defects 250, such as unwanted ALD growth nodules, are formed. The defects 250 are removed in an etch operation, which decreases the thickness of the ALD growth 240, as depicted in FIG. 2H.

The process of FIGS. 2A through 2H may be repeated a number of times to increase the thickness of the ALD growth 240. Prior to each such repeat, an anneal operation may be performed to remove the effects of the previous plasma treatments.

Figure 3A:
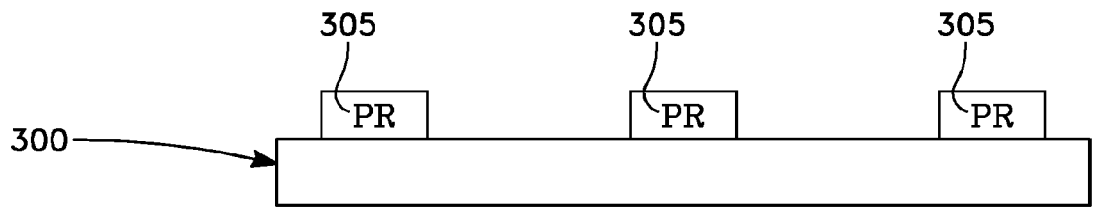
FIGS. 3A, 3B, 3C, 3D, 3E, 3F, 3G and 3H depict successive operations of a process performed on a workpiece, in accordance with a third embodiment
Figure 3B:
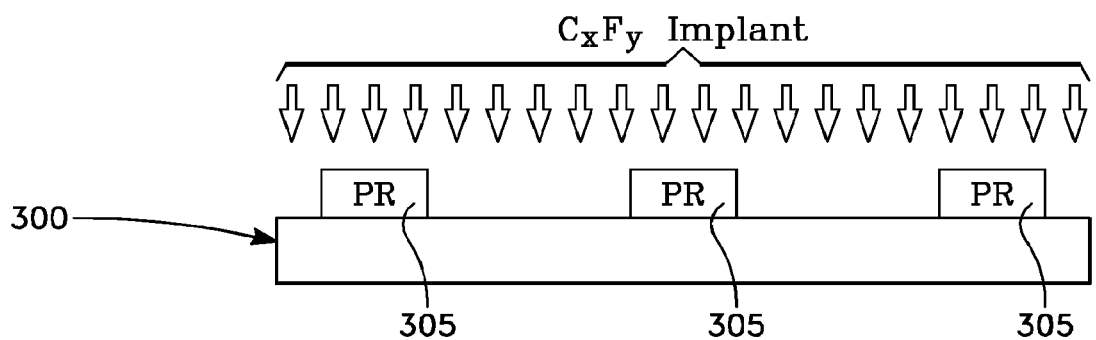
Figure 3C:
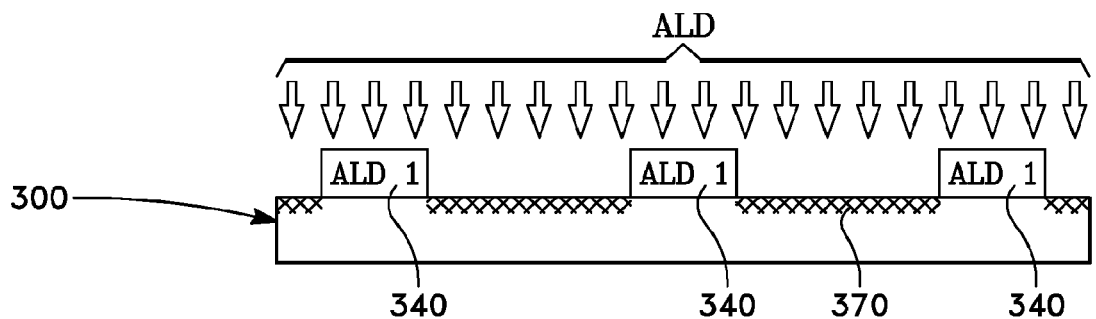
Figure 3D:
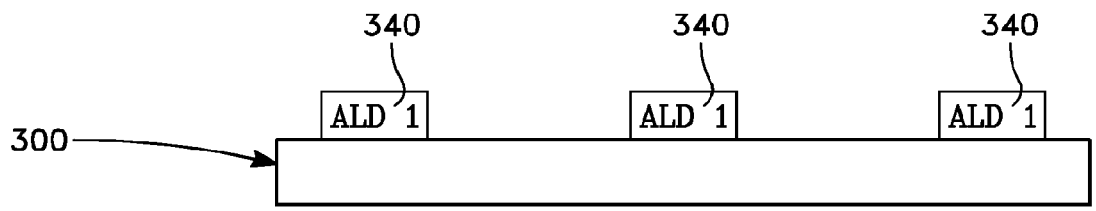
Figure 3E:
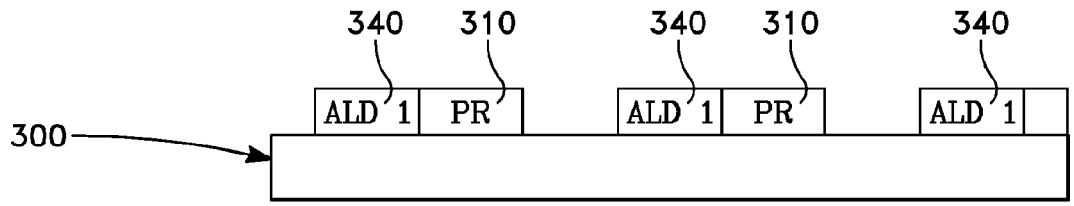
Figure 3F:
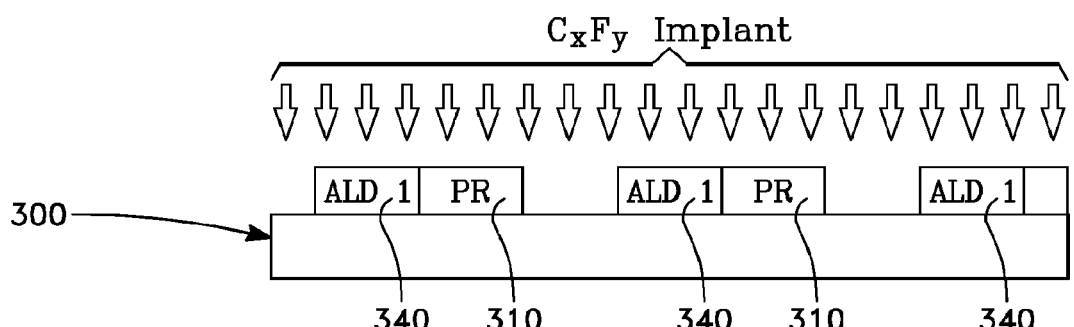
Figure 3G:
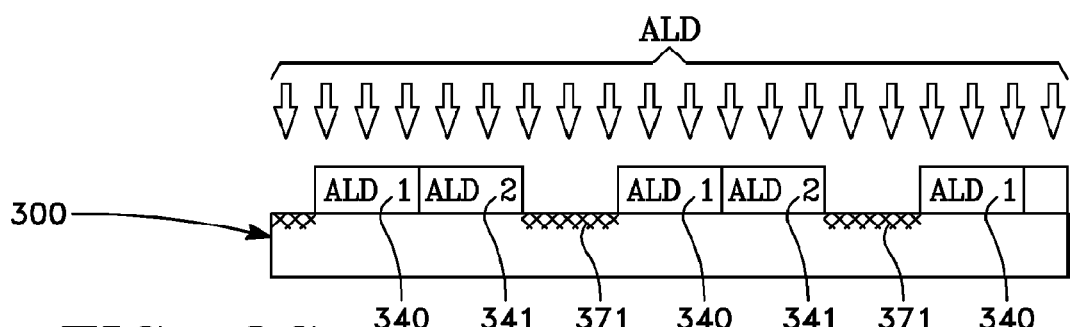
Figure 3H:
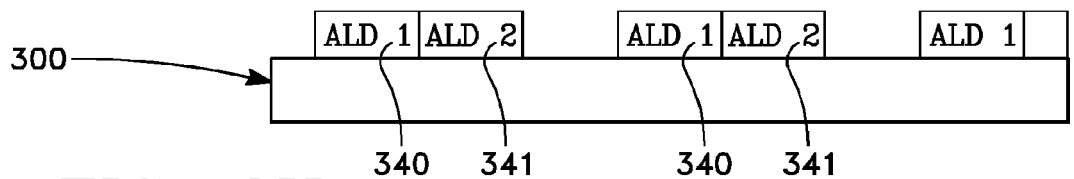

FIGS. 3A through 3H depict a process in accordance with a third embodiment. In FIG. 3A, a workpiece surface 300 is patterned by a photoresist layer 305 using photolithography, leaving portions of the workpiece surface 300 exposed. In the next operation, which is depicted in FIG. 3B, a first plasma treatment is performed by exposing the workpiece surface 300 to a fluoro-carbon plasma. This produces a plasma treated surface layer 370 indicated in FIG. 3C. Then, the photoresist layer 305 is removed and a first ALD process is performed, as indicated in FIG. 3C. The resulting ALD growth 340 shown in FIG. 3C coincides with locations on the workpiece surface 300 not treated by the plasma and which are hydrophilic. Thereafter, the workpiece surface 300 is subjected to an anneal procedure (FIG. 3D) to remove the effects of the plasma treatment previously performed in FIG. 3B. This renders the exposed portions of the workpiece surface 300 hydrophilic. Next, as indicated in FIG. 3E, a second photoresist layer 310 is deposited on the workpiece surface 300 as shown in FIG. 3E. The pattern of the new photoresist layer 310 may be shifted relative to the previous photoresist layer 305 (now removed), as shown in FIG. 3E. A second plasma treatment is performed as depicted in FIG. 3F, which produces a plasma treated surface layer 371 extending beyond the plasma treated surface layer 370, as indicated in FIG. 3G. Then the second photoresist layer 310 is removed and a second ALD process is performed, as indicated in FIG. 3G. This second ALD process results in a second ALD growth layer 341. The ALD growth layers 340 and 341 may be of the same or different materials, depending upon the ALD processes employed. Next, the workpiece surface 300 is subjected to an anneal procedure (FIG. 3H) to remove the effects of the fluoro-carbon plasma treatment of FIG. 3F. Another way to remove the effect of fluorocarbon plasma treatment is by exposing the surface to another type of plasma such as, for example, an Ar plasma or a N plasma.

The foregoing process of FIGS. 3A through 3H may be repeated for multi-zone patterning of several or many different materials. The materials may include any material that can be formed by ALD, such as (but not limited to metals, non-metals, nitrides, metal oxides, HfO2, ZrO2, TiO2, SiO2, ZnO, and other similar materials, as some examples.

Figure 4A:
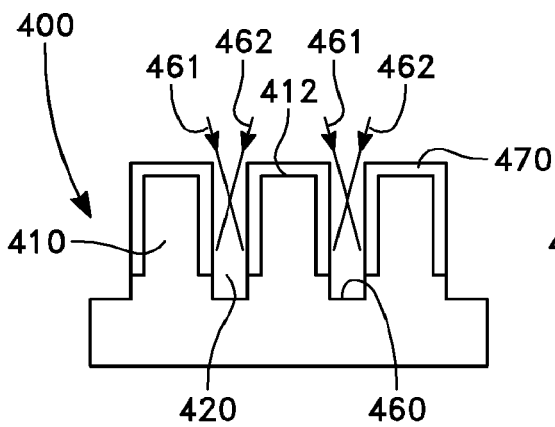
FIGS. 4A and 4B depict successive operations of a process performed on a workpiece in accordance with a fourth embodiment.
Figure 4B:
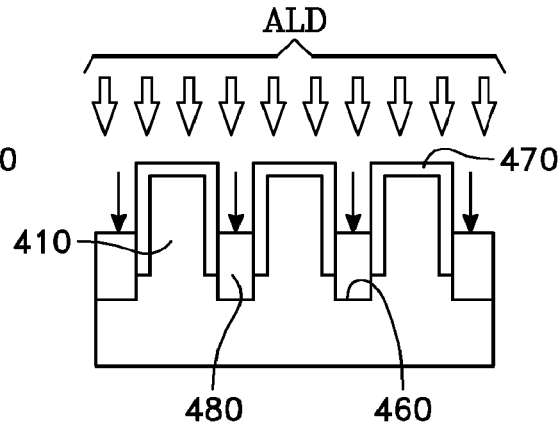

FIGS. 4A and 4B depict a process for ALD in selected areas, by employing shadowing effects of three-dimensional structures on the workpiece surface. In FIG. 4A, a workpiece 400 has vertical surfaces 410 spaced apart by trenches 420, the vertical surfaces 410 comprising a hydrophilic material. Selected portions of the vertical surfaces 410 are changed from hydrophilic to hydrophobic by treatment with a directional plasma or plasma beam of a fluoro-carbon species. Also, the vertical surfaces 410 are similarly treated. The plasma treatment forms plasma treated surface layers 470.

The plasma beam includes two beams 461, 462, of respective beam directions tilted through different angles, such as (for example) equal and opposite angles relative to the vertical surfaces 410. The tilt angle, the width of trench 420 and the depth of the trench 420 are such that the plasma beams 461, 462 do not reach bottom surface 460 of the trench 420. The plasma-treated surface layers 470 extend partially toward the bottom surface 460.

Next, an ALD process is performed as depicted in FIG. 4B. The growth of ALD material 480 occurs inside the trench 420 starting at the bottom surface 460 and progresses upwardly from the bottom surface 460. The plasma-treatment changes the exposed surfaces from hydrophilic to hydrophobic, preventing ALD growth on the exposed surfaces.

Figure 5A:
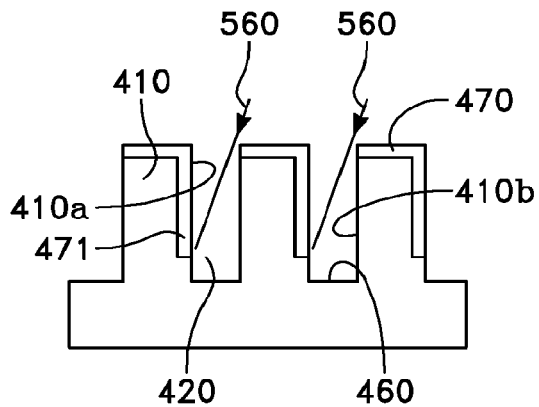
FIGS. 5A and 5B depict successive operations of a process performed on a workpiece in accordance with a fifth embodiment.
Figure 5B:
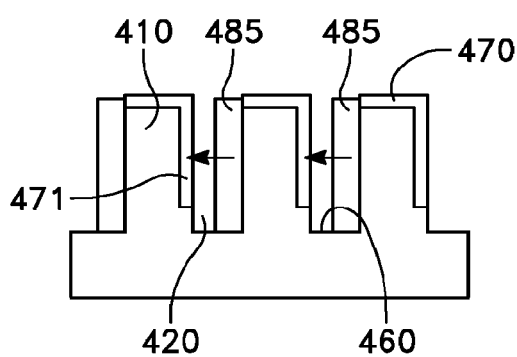

FIGS. 5A and 5B depict a modification of the process of FIGS. 4A and 4B. In FIGS. 5A and 5B, only a single tilted plasma beam 560 is needed. In FIG. 5A, only one side (e.g., vertical surface 410a) of each vertical feature is exposed to plasma treatment to form a plasma-treated surface layer 471. The vertical surface 410b is untreated and remains hydrophilic. As depicted in FIG. 5B, an ALD process is performed and produces growth material 485 on the vertical surface 410b.

Figure 6A:
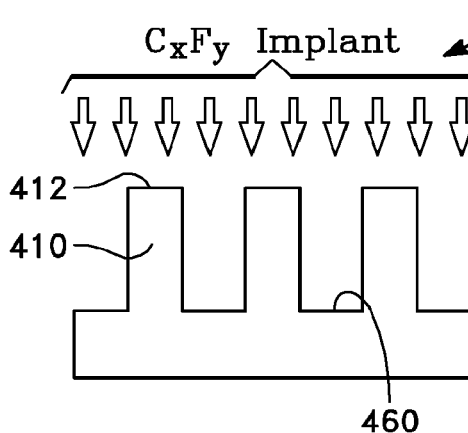
FIGS. 6A and 6B depict successive operations of a process performed on a workpiece in accordance with a fifth embodiment.
Figure 6B:
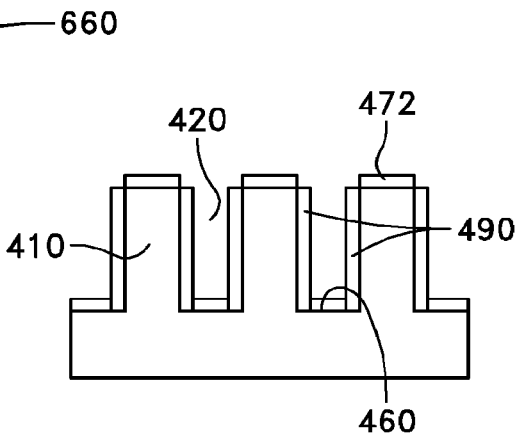

In FIG. 6A, an untilted (vertical) plasma beam 660 is employed to perform plasma treatment. The result is that only horizontal surfaces (i.e., top surfaces 412 and bottom surfaces 460) are rendered hydrophobic by the formation of plasma treated surface layer 472. Next, an ALD process is performed as depicted in FIG. 6B, depositing an ALD growth material 490 on the vertical surfaces 410 only.

While the foregoing is directed to embodiments of the present invention, other and further embodiments of the invention may be devised without departing from the basic scope thereof, and the scope thereof is determined by the claims that follow.

What is claimed is:

1. A method of performing atomic layer deposition in selected zones of a workpiece, comprising:
   depositing a first photolithographic mask on said workpiece comprising first openings corresponding to portions of said selected zones;
   treating said workpiece by exposure to species derived from a fluoro-carbon plasma;
   removing said first photolithographic mask;
   depositing a second photolithographic mask on said workpiece comprising second openings corresponding to remaining portions of said selected zones;
   treating said workpiece by exposure to species derived from a fluoro-carbon plasma;
   removing said second photolithographic mask; and
   performing an atomic layer deposition process.

2. The method of claim 1 further comprising removing growth material from areas outside of said selected zones.

3. The method of claim 1 wherein said treating said workpiece by exposure to species derived from a fluoro-carbon plasma comprises forming a fluoro-carbon plasma and exposing said workpiece to said plasma.

4. The method of claim 1 wherein said treating said workpiece by exposure to species derived from a fluoro-carbon plasma comprises forming an ion beam from a fluoro-carbon plasma and directing said ion beam to said workpiece.

5. The method of claim 1 wherein said atomic layer deposition process produces a growth material.

6. A method of performing atomic layer deposition in selected zones of a workpiece, comprising:
   depositing a first photolithographic mask on said workpiece comprising first openings corresponding to portions of said selected zones;
   treating said workpiece by exposure to species derived from a fluoro-carbon plasma;
   removing said first photolithographic mask;
   performing a first atomic layer deposition process on said workpiece;
   depositing a second photolithographic mask on said workpiece comprising second openings corresponding to remaining portions of said selected zones;
   treating said workpiece by exposure to species derived from a fluoro-carbon plasma;
   removing said second photolithographic mask; and
   performing a second atomic layer deposition process.

7. The method of claim 6 wherein said first and second atomic layer deposition processes deposit different growth materials on said workpiece.

8. The method of claim 6 wherein said treating said workpiece by exposure to species derived from a fluoro-carbon plasma comprises forming a fluoro-carbon plasma and exposing said workpiece to said plasma.

9. The method of claim 6 wherein said treating said workpiece by exposure to species derived from a fluoro-carbon plasma comprises forming an ion beam from a fluoro-carbon plasma and directing said ion beam to said workpiece.

10. The method of claim 6 wherein said first and second atomic layer deposition process produce on said workpiece different respective growth materials.

11. A method of performing atomic layer deposition in selected zones of a workpiece having 3-dimensional structures on a surface thereof comprising vertical walls separated by trenches, comprising:
    providing a directional plasma source emitting ions along an ion propagation direction toward said workpiece;
    orienting said ion propagation direction relative to said vertical walls to enable said vertical walls to mask said selected zones from the ions emitted by said directional plasma source; and
    performing an atomic layer deposition process on said workpiece.

12. The method of claim 11 wherein said directional plasma source emits ions in two beams tilted relative to said vertical walls through opposing angles and said two beams strike opposing ones of said vertical walls.

13. The method of claim 11 wherein said directional plasma source emits a beam tilted relative to said vertical walls and said beams strikes one of said vertical walls.

14. The method of claim 11 wherein said directional plasma source emits ions in one beam parallel to said vertical walls.

* * * * *